(12) United States Patent
Phillps et al.

(10) Patent No.: US 8,194,409 B2
(45) Date of Patent: Jun. 5, 2012

(54) GUIDE FRAME FOR A PLUGGABLE MODULE

(75) Inventors: Michael J. Phillps, Camp Hill, PA (US); Michael E. Cowher, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 326 days.

(21) Appl. No.: 12/614,904

(22) Filed: Nov. 9, 2009

(65) Prior Publication Data

US 2011/0110055 A1 May 12, 2011

(51) Int. Cl.
*H05K 5/00* (2006.01)
(52) U.S. Cl. .......................... 361/756; 361/727; 361/741
(58) Field of Classification Search .................. 361/756, 361/727, 741, 686, 802; 439/374, 377
See application file for complete search history.

(56) References Cited

U.S. PATENT DOCUMENTS

| 5,233,594 | A | * | 8/1993 | Wilhelm | 361/679.37 |
|---|---|---|---|---|---|
| 6,095,862 | A | | 8/2000 | Doye et al. | |
| 6,128,200 | A | * | 10/2000 | Chu | 361/760 |
| 6,178,096 | B1 | | 1/2001 | Flickinger et al. | |
| 6,264,499 | B1 | | 7/2001 | Costello et al. | |

* cited by examiner

*Primary Examiner* — Hung S Bui

(57) ABSTRACT

A guide frame is provided for receiving a pluggable module having guide members that include upper and lower surfaces. The guide frame includes side segments extending lengths from loading ends to mating ends. The side segments are spaced apart from each other to define a receptacle extending therebetween. The receptacle is configured to receive the pluggable module therein. The side segments include upper and lower guide rails for guiding the pluggable module within the receptacle. The upper and lower guide rails are configured to engage the upper and lower surfaces, respectively, of the guide members of the pluggable module when the pluggable module is received within the receptacle. The guide frame also includes a cross member extending from, and interconnecting, the side segments.

20 Claims, 9 Drawing Sheets

GUIDE FRAME FOR A PLUGGABLE MODULE

BACKGROUND OF THE INVENTION

The subject matter described and/or illustrated herein relates generally to pluggable modules, and more particularly, to guide frames for pluggable modules.

Various types of fiber-optic and copper based pluggable modules (sometimes referred to as "transceivers") are known. The pluggable modules permit communication between host equipment and external devices. The pluggable modules are plugged into a receptacle assembly that is mounted on a substrate, for example a printed circuit, within the host equipment. The receptacle assembly typically includes a receptacle defined between individual opposed guide rails that are separately mounted on the substrate. The pluggable module is loaded through a front end of the receptacle and mates with an interface connector positioned at a rear end of the receptacle. The interface connector is typically covered by a cover that is mounted on the substrate separately from the guide rails and the interface connector. The cover includes an opening that enables the pluggable module to mate with the interface connector through the cover. As the pluggable module is loaded into the receptacle, the guide rails guide the pluggable module within the receptacle to align the pluggable module with the interface connector.

Because the guide rails are typically separate components that are separately mounted on the substrate, the guide rails may not accurately align the pluggable module with the interface connector. Misalignment between the pluggable module and the interface connector may make it difficult or impossible to mate the pluggable module with the interface connector. For example, the guide rails are typically mounted on the substrate using fasteners that extend through openings within the guide rails and into openings within the substrate. However, tolerances at the openings of one of the guide rails and the substrate may add up with the tolerances at the openings of the other guide rail and the substrate, such that the guide rails are not positioned relative to each other to adequately align the pluggable module with the interface connector.

The cover may also make it difficult or impossible to mate the pluggable module with the interface connector. For example, because the cover is a separate component from the guide rails that is separately mounted on the substrate, tolerances at the mounting interface between the cover and the substrate may add up with the tolerances at the mounting interfaces between the guide rails of the substrate. The cover may thereby be positioned relative to the guide rails such that the cover opening is not positioned to enable the pluggable module to extend therethrough and mate with the interface connector.

BRIEF DESCRIPTION OF THE INVENTION

In one embodiment, a guide frame is provided for receiving a pluggable module having guide members that include upper and lower surfaces. The guide frame includes side segments extending lengths from loading ends to mating ends. The side segments are spaced apart from each other to define a receptacle extending therebetween. The receptacle is configured to receive the pluggable module therein. The side segments include upper and lower guide rails for guiding the pluggable module within the receptacle. The upper and lower guide rails are configured to engage the upper and lower surfaces, respectively, of the guide members of the pluggable module when the pluggable module is received within the receptacle. The guide frame also includes a cross member extending from, and interconnecting, the side segments.

In another embodiment, a receptacle assembly is provided for a pluggable module that mates with an interface connector. The assembly includes a guide frame having side segments extending lengths from loading ends to mating ends. The side segments are spaced apart from each other to define a receptacle extending therebetween. The receptacle is configured to receive the pluggable module therein. The assembly also includes a cover that is configured to cover at least a portion of the interface connector. The cover is mechanically connected to the guide frame.

DETAILED DESCRIPTION OF THE INVENTION

Figure 1:
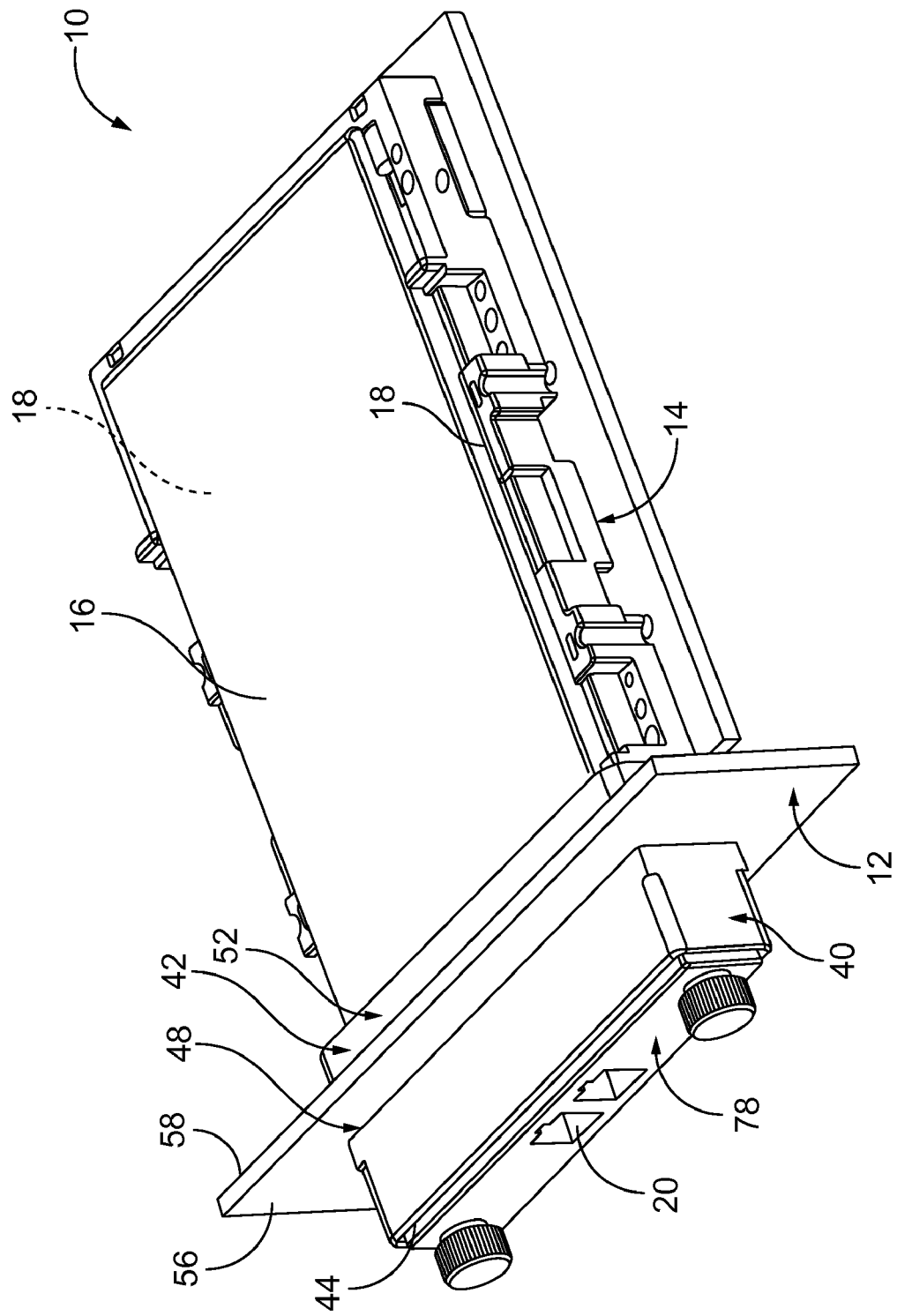
FIG. 1 is a perspective view of an exemplary embodiment of a connector assembly and an exemplary panel.

FIG. 1 is a perspective view of an exemplary embodiment of a connector assembly 10 and an exemplary panel 12. The connector assembly 10 includes a receptacle assembly 14 and a pluggable module 16. The receptacle assembly 14 includes a receptacle 18 that receives the pluggable module 16 therein. In the exemplary embodiment, the connector assembly 10 constitutes an input/output assembly for a device such as, but not limited to, a computer, a network switch, and/or the like. The pluggable module 16 may represent a line card, a transceiver module, and/or the like that is pluggable into the receptacle assembly 14, but is not limited thereto. The pluggable module 16 includes one or more ports 20 for interfacing with data cables, such as, but not limited to, communication cables and/or the like. Optionally, the data cables may be copper wire data cables or fiber-optic data cables. The connector assembly 10 illustrated in FIG. 1 shows a single receptacle assembly 14 having a single pluggable module 16 received therein. But, the connector assembly 10 may include any number of receptacle assemblies 14 for receiving any number of pluggable modules 16 therein.

Figure 2:
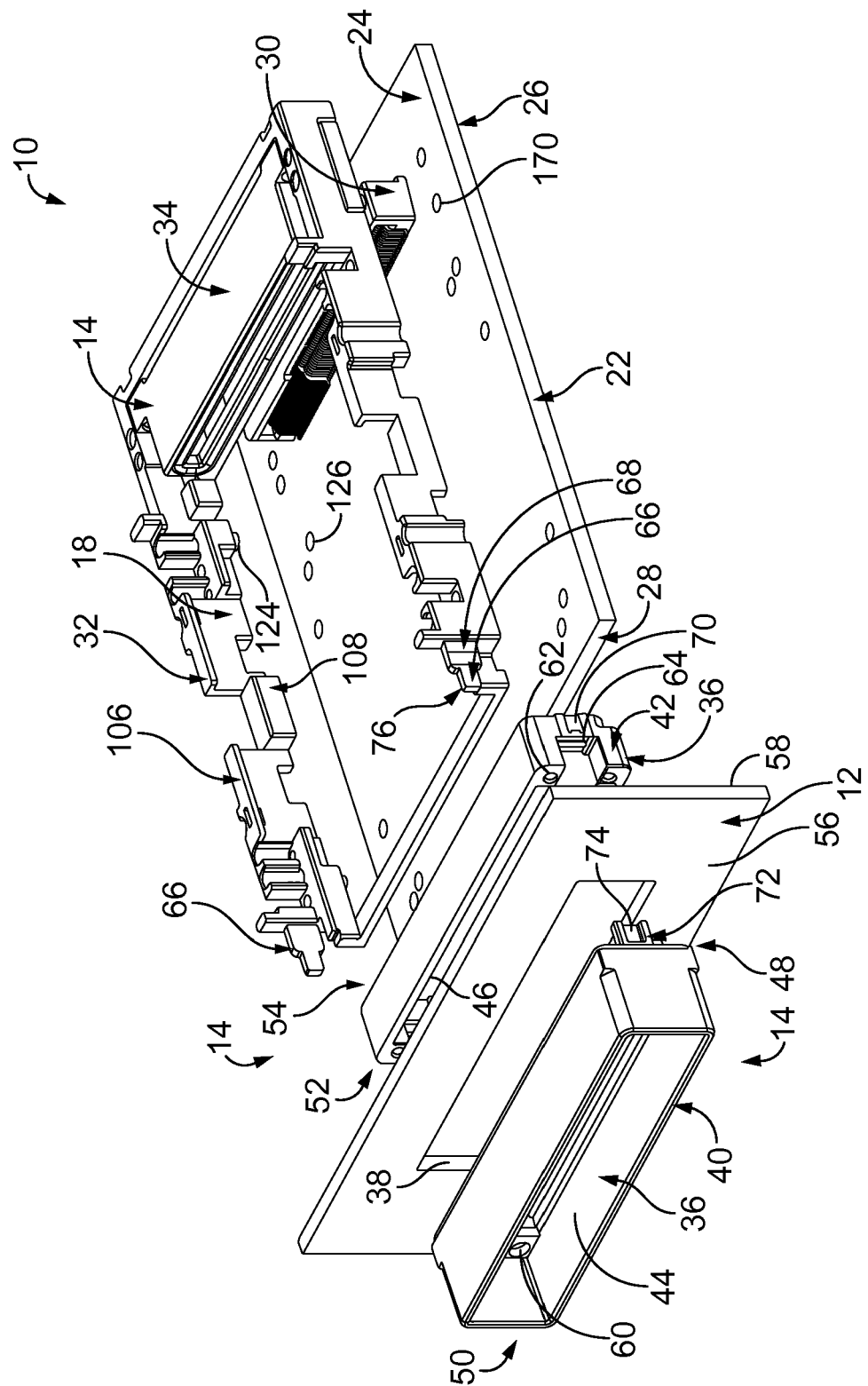
FIG. 2 is a partially exploded perspective view of the connector assembly and panel shown in FIG. 1.

FIG. 2 is a partially exploded perspective view of the connector assembly 10 and panel 12. The pluggable module 16 (FIGS. 1 and 3) has been removed from FIG. 2 to better illustrate the other components of the connector assembly 10. The connector assembly 10 includes a substrate 22, which is optionally a printed circuit. The substrate 22 includes a side 24 and a side 26 that is opposite the side 24. The substrate 22 also includes a front edge 28. In the exemplary embodiment, only the side 24 includes a receptacle assembly 14 mounted thereon. In addition or alternatively, the side 26 may include a receptacle assembly 14 mounted thereon. In the exemplary embodiment, the side 24 of the substrate 22 defines a bottom boundary of the receptacle 18 of the receptacle assembly 14. Alternatively, another component may extend along the substrate 22 and define the bottom boundary of the receptacle 18. For example, a frame (not shown) or housing (not shown) may be supported by the substrate 22 and define the bottom boundary of the receptacle 18.

As used herein, the term "printed circuit" is intended to mean any electric circuit in which the conducting connections have been printed or otherwise deposited in predetermined patterns on and/or within an electrically insulating substrate. The substrate 22 may be a flexible substrate or a rigid substrate. The substrate 22 may be fabricated from and/or include any material(s), such as, but not limited to, ceramic, epoxy-glass, polyimide (such as, but not limited to, Kapton® and/or the like), organic material, plastic, polymer, and/or the like. In some embodiments, the substrate 22 is a rigid substrate fabricated from epoxy-glass, which is sometimes referred to as a "circuit board". The substrate 22 may include any number of layers.

The connector assembly 10 includes an interface connector 30. The interface connector 30 may be mounted directly on the substrate 22, or alternatively may be indirectly supported by or positioned proximate to the substrate 22. In the exemplary embodiment, the interface connector 30 is mechanically and electrically connected to the substrate 22. Optionally, the interface connector 30 is positioned along and/or defines a rear of the receptacle 18 of the receptacle assembly 14. The interface connector 30 mates with the pluggable module 16 when the pluggable module 16 is loaded into the receptacle 18.

The receptacle assembly 14 includes a guide frame 32, a cover 34, and a bracket 36. The cover 34 covers at least a portion of the interface connector 30. The guide frame 32 defines the receptacle 18 and includes one or more guide rails 106 and/or 108 that guide the pluggable module 16 within the receptacle 18. As will be described below, the cover 34 is mechanically connected to the guide frame 32.

Optionally, a port end 78 (FIGS. 1 and 3) of the pluggable module 16 extends through an opening 38 that extends through the panel 12. The pluggable module 16 may be loaded into the receptacle 18 through the opening 38. Alternatively, the pluggable module 16 is loaded into the receptacle 18 before the port end 78 of the pluggable module 16 is received through the panel opening 38, such that the pluggable module 16 is received through the opening 38 of the panel 12 after being loaded into the receptacle 18.

In the exemplary embodiment, a bracket 36 is mounted on the panel 12 at the opening 38. The bracket 36 may facilitate containing electromagnetic interference (EMI). The bracket 36 includes a shroud 40 and a backing plate 42. The shroud 40 and backing plate 42 include respective openings 44 and 46 for receiving the pluggable module 16. The shroud 40 extends a length from an end 48 to an opposite end 50. The backing plate 42 extends a length from an end 52 to an opposite end 54. The end 48 of the shroud 40 engages a side 56 of the panel 12, while the end 52 of the backing plate 42 engages an opposite side 58 of the panel 12. The shroud 40 and the backing plate 42 mechanically connect together to hold the panel 12 therebetween. The shroud 40 and the backing plate 42 each include one or more respective openings 60 and 62 for receiving corresponding fasteners (not shown) that mechanically connect the shroud 40 to the backing plate 42. Each of the openings 60 and/or 62 is optionally threaded for engaging a threaded fastener to mechanically connect the shroud 40 and backing plate 42. In the exemplary embodiment, the fasteners that mechanically connect the shroud 40 and the backing plate 42 extend through the opening 38 of the panel 12 when the panel 12 is held between the shroud 40 and the backing plate 42. Alternatively, the panel 12 may include one or more other openings (not shown) proximate the opening 38 through which the fasteners that mechanically connect the shroud 40 and the backing plate 42 may extend. In addition or alternative to the openings 60 and/or 62, the shroud 40 and the backing plate 42 may be mechanically connected together using any other structure, means, fasteners, and/or the like, such as, but not limited to, using a latch, a clip, an interference (or clearance) fit, a snap fit, and/or the like.

The backing plate 42 includes one or more optional openings 64 for mechanically connecting the guide frame 32 to the backing plate 42 and the shroud 40. The openings 64 receive arms 66 of the guide frame 32 therein. The arms 66 include latch shoulders 68. Resilient latch hooks 70 of the backing plate 42 are positioned to extend within the openings 64. The latch hooks 70 engage the latch shoulders 68 of the corresponding arms 66 of the guide frame 32 in a snap-fit connection to mechanically connect the guide frame 32 to the backing plate 42. The guide frame 32 optionally engages the shroud 40. Specifically, the shroud 40 includes one or more optional extensions 72 that extend outwardly at the end 48. In the exemplary embodiment, the extensions 72 extend into the opening 38 of the panel 12 when the panel 12 is held between the shroud 40 and the backing plate 42. The extensions 72 include slots 74 that receive ends 76 of the arms 66 of the guide frame 32 therein. Specifically, the arms 66 extend through the openings 64 of the backing plate 42 such that the ends 76 of the arms 66 extend outwardly from the openings 64 and into the slots 74.

Although the arm ends 76 and the extensions 72 engage each other within the opening 38 of the panel 12, alternatively the panel 12 may include one or more other openings (not shown) proximate the opening 38 through which the arm ends 76 and the extensions 72 extend. In addition or alternative to the openings 64, the arms 66, the shoulders 68, the latch hooks 70, and/or the snap-fit connection, the guide frame 32 may be mechanically connected to the backing plate 42 using any other structure, means, fasteners, and/or the like, such as, but not limited to, using a clip, a threaded fastener, an interference (or clearance) fit, and/or the like. Moreover, in addition or alternative to the arm ends 76, the extensions 72, and/or the slots 74, the guide frame 32 may engage the shroud 40 using any other structure, means, fastener, and/or the like, such as, but not limited to, using a clip, a threaded fastener, a snap fit, an interference (or clearance) fit, and/or the like.

Referring to FIG. 1, the panel 12 is shown held between the shroud 40 and the backing plate 42. Specifically, the end 48 of the shroud 40 is engaged with the side 56 of the panel 12, and the end 52 of the backing plate 42 is engaged with the side 58 of the panel 12. The shroud 40 and backing plate 42 are mechanically connected together using the fasteners to hold the panel 12 between the shroud 40 and backing plate 42. The pluggable module 16 extends through the backing plate opening 46 (FIG. 2) and the panel opening 38 (FIG. 2). A port end 78 of the pluggable module 16 extends within the shroud opening 44 such that the shroud 40 extends around the port end 78 of the pluggable module 16.

Figure 3:
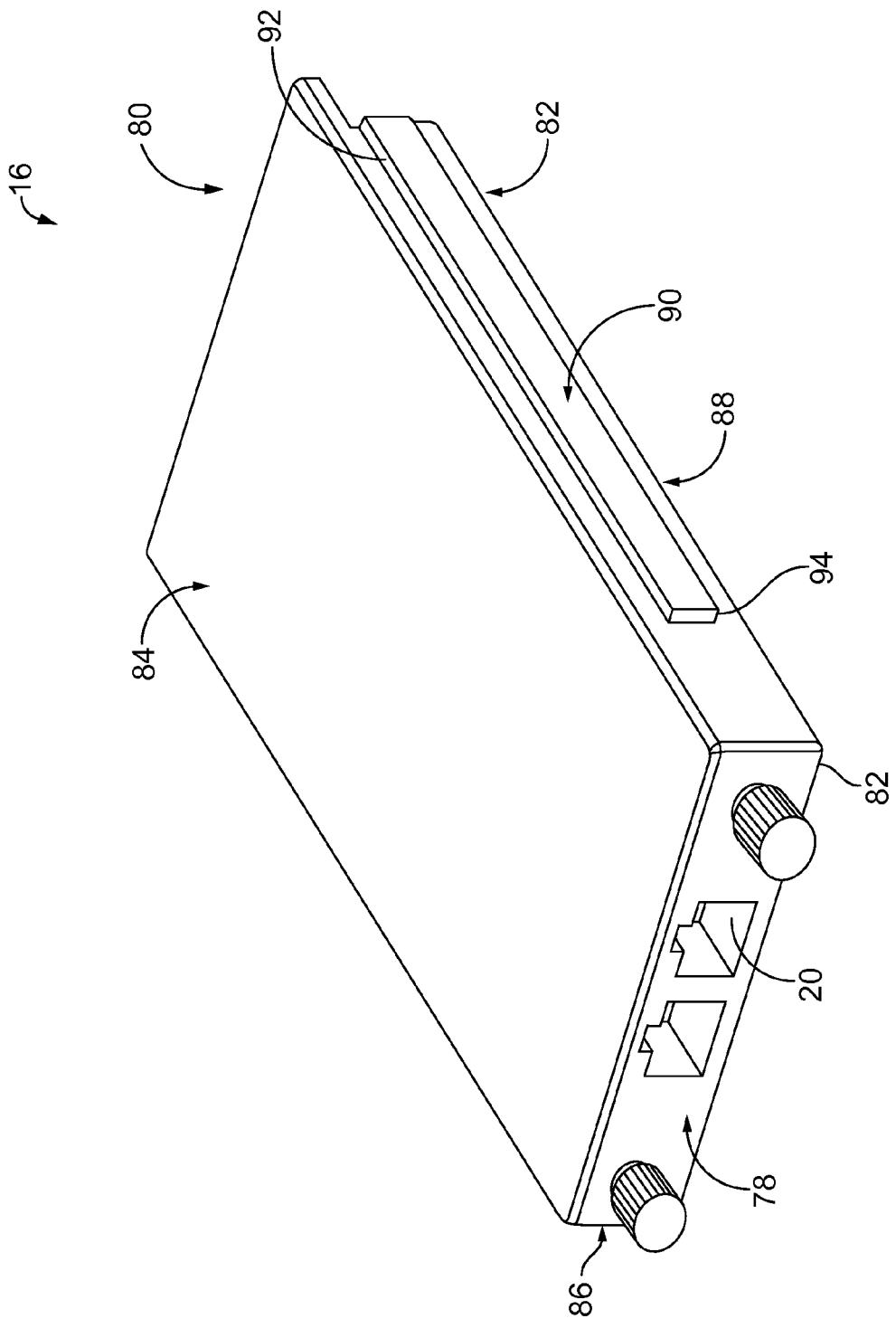
FIG. 3 is a perspective view of an exemplary embodiment of a pluggable module of the connector assembly shown in FIGS. 1 and 2.

FIG. 3 is a perspective view of an exemplary embodiment of a pluggable module 16. The pluggable module 16 extends a length from the port end 78 to a mating end 80 that is opposite the port end 78. The pluggable module 16 is configured to be mated with the interface connector 30 (FIG. 2) at the mating end 80. The port end 78 includes the ports 20 that receive mating plugs (not shown). The mating plugs communicate with the interface connector 30 via the pluggable module 16. The pluggable module 16 includes a side 82 and an opposite side 84. When the pluggable module 16 is loaded into the receptacle assembly 14 (FIGS. 1 and 2), the side 82 faces the substrate 22 (FIG. 2) and the side 84 faces away from the substrate 22. Sides 86 and 88 extend between, and interconnect, the sides 82 and 84. In the exemplary embodiment, the pluggable module 16 has a generally box-shaped body, however the pluggable module 16 may additionally or alternatively include any other shape for being received within any shaped receptacle 18 (FIGS. 1, 2, 4, 8, and 9).

The pluggable module 16 includes one or more guide members 90. Each of the sides 86 and 88 includes a guide member 90 in the exemplary embodiment, although only the guide member 90 of the side 88 is visible in FIG. 3. Alternatively, only one of the sides 86 or 88 includes a guide member 90. In the exemplary embodiment, the guide members 90 are extensions that extend outwardly at the sides 86 and 88. The guide members 90 include upper and lower surfaces 92 and 94, respectively. Although shown as extending approximately parallel to each other, the upper surfaces 92 may extend at any other angle than approximately parallel relative to the lower surface 94 of the same guide member 90. In some alternative embodiments, one or both of the guide members 90 may include a slot (not shown). As will be described below, the guide members 90 interact with the guide frame 32 (FIGS. 2, 4, 5, 8, and 9) for guiding the pluggable module 16 within the receptacle 18 of the receptacle assembly 14.

Figure 4:
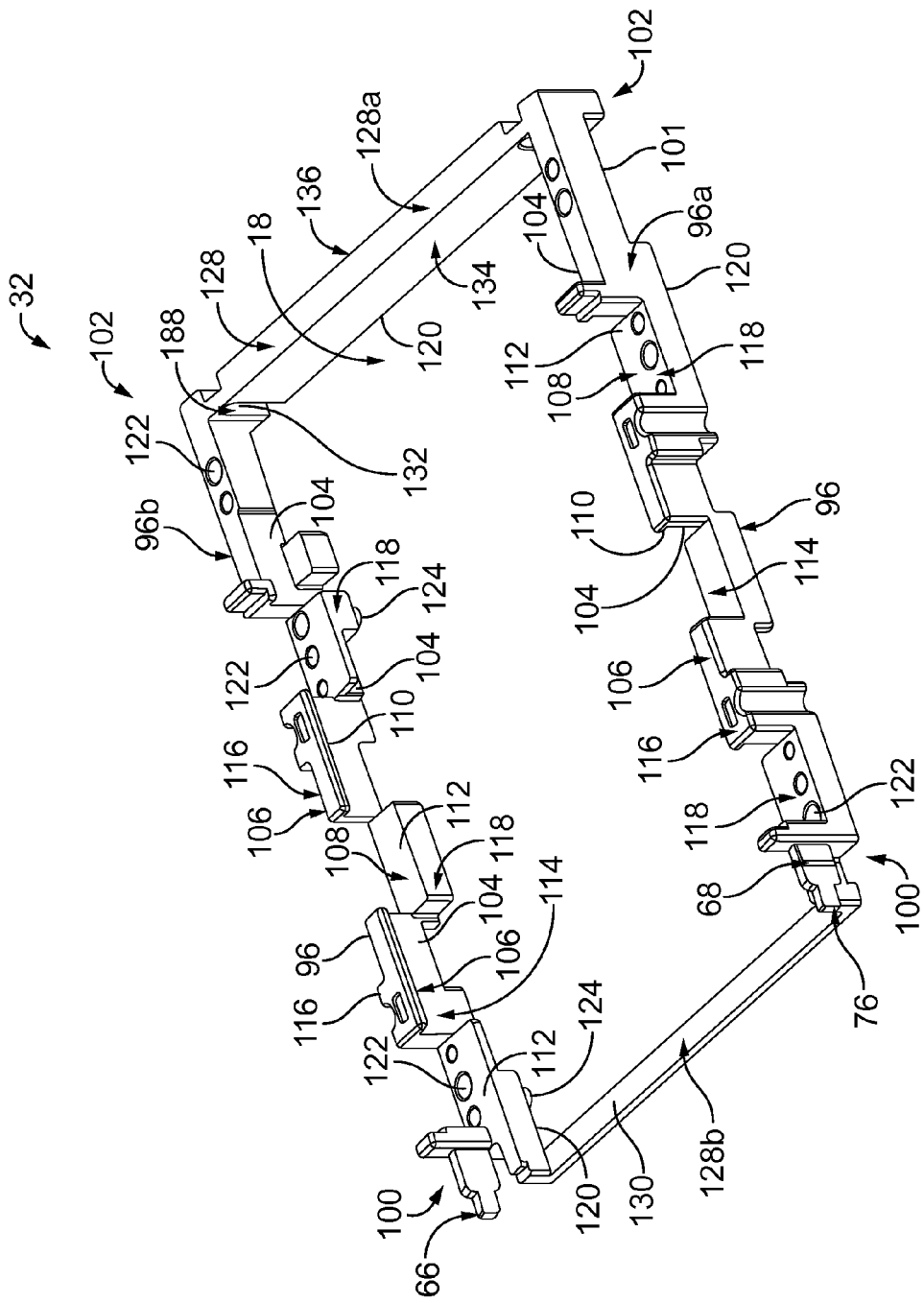
FIG. 4 is a perspective view of an exemplary embodiment of a guide frame of the connector assembly shown in FIGS. 1 and 2.

FIG. 4 is a perspective view of an exemplary embodiment of the guide frame 32. The guide frame 32 includes a pair of side segments 96. Each side segment 96 extends a length from a loading end 100 to a mating end 102 that is opposite the loading end 100. Each side segment 96 includes an optional recess 101 for receiving a corresponding flange 148 (FIG. 6-9) or 150 (FIGS. 6, 7, and 9) of the cover 34 (FIGS. 2 and 6-9). The side segments 96 include the arms 66, which extend outwardly at the loading ends 100 of the side segments 96 to the arm ends 76. The arms 66 include the latch shoulders 68. Although two are shown, the guide frame 32 may include any number of the arms 66 for reception within any number of the openings 64 (FIG. 2) of the backing plate 42 (FIGS. 1 and 2) and for engagement with any number of the extensions 72 (FIG. 2) of the shroud 40 (FIGS. 1 and 2). In some alternative embodiments, only one of the side segments 96 includes an arm 66. Moreover, in some alternative embodiments, one or both of the side segments 96 includes more than one arm 66.

The side segments 96 are spaced apart from each other to define the receptacle 18, which extends between the side segments 96. Specifically, each side segment 96 includes an inner surface 104 that defines a side boundary of the receptacle 18. As described above, the receptacle 18 is configured to receive the pluggable module 16 (FIGS. 1 and 3) therein. In addition or alternative to the shape shown herein, the receptacle 18 may include any other shape for receiving a pluggable module 16 including any shape.

The guide frame 32 includes one or more upper guide rails 106 and/or one or more lower guide rails 108. In the exemplary embodiment, each side segment 96 includes an upper guide rail 106 and a lower guide rail 108. The upper and lower guide rails 106 and 108, respectively, interact with the guide members 90 (FIG. 3) of the pluggable module 16 for guiding the pluggable module 16 within the receptacle 18. Specifically, as the pluggable module 16 is loaded into the receptacle 18, the upper and lower guide rails 106 and 108, respectively, of each side segment 96 are configured to engage the upper and lower surfaces 92 and 94 (FIG. 3), respectively, of a corresponding one of the guide members 90 of the pluggable module 16.

The upper guide rails 106 are defined by extensions that extend outwardly from the inner surfaces 104 of the side segments 96 into the receptacle 18. Similarly, the lower guide rails 108 are defined by extensions that extend outwardly from the inner surfaces 104 of the side segments into the receptacle 18. The upper and lower guide rails 106 and 108, respectively, include respective upper and lower guide surfaces 110 and 112 that engage the upper and lower surfaces 92 and 94, respectively, of the corresponding guide member 90 of the pluggable module 16. A slot 114 is defined between the upper and lower guide rails 106 and 108, respectively, of each side segment 96. Each slot 114 is configured to receive a corresponding one of the guide members 90 of the pluggable module 16 therein when the pluggable module 16 is received within the receptacle 18.

Each of the upper guide rails 106 is optionally segmented along the length of the corresponding side segment 96 into a plurality of upper guide elements 116. The upper guide elements 116 are spaced apart from each other along the length of the corresponding side segment 96 and include the upper guide surfaces 110. Similarly, each of the lower guide rails 108 is optionally segmented along the length of the corresponding side segment 96 into a plurality of lower guide elements 118. The lower guide elements 118 are spaced apart from each other along the length of the corresponding side segment 96 and include the lower guide surfaces 112. As can be seen in FIG. 4, the lower guide elements 118 of each side segment 96 are optionally positioned at different locations along the length of the side segment 96 than the upper guide elements 116 of the same side segment 96. Moreover, adjacent upper guide elements 116 of each of the side segments 96 are optionally spaced apart from each other along the length of the side segment 96 by a lower guide element 118 of the same side segment 96, and vice versa.

In the exemplary embodiment, each side segment 96 includes both an upper guide rail 106 and a lower guide rail 108. But, in some alternative embodiments, one or both of the side segments 96 may not include an upper guide rail 106 and/or may not include a lower guide rail 108, so long as at least one of the side segments 96 includes at least an upper guide rail 106 or a lower guide rail 108. Although two are shown, the guide frame 32 may include any number of the upper guide rails 106 and any number of the lower guide rails 108. In the exemplary embodiment, the upper and lower surfaces 110 and 112, respectively, of the upper and lower guide rails 106 and 108, respectively, of the same side segment 96 extend approximately parallel to each other. But, the upper surfaces 110 of the upper guide rails 106 may extend at any other angle than approximately parallel relative to the lower surface 112 of the lower guide rail 108 of the same side segment 96. Each upper guide rail 106 may include any number of upper guide elements 116. Each lower guide rail 108 may include any number of lower guide elements 118. In some alternative embodiments, one or more of the upper guide rails 106 and/or one or more of the lower guide rails 108 is not segmented.

The guide frame 32 includes a mounting surface 120 that is configured to be mounted on the side 24 (FIG. 2) of the substrate 22 (FIG. 2). The guide frame 32 includes one or more openings 122 for mounting the guide frame 32 on the substrate 22. In the exemplary embodiment, the openings 122 extend through the side segments 96. The openings 122 enable the guide frame 32 to be mounted on the substrate 22 using fasteners (not shown) that are received through the openings 122. Each of the openings 122 is optionally threaded for engaging a threaded fastener. In some alternative embodiments, the fasteners that are received through the openings 122 engage another guide frame (not shown) that is mounted on the side 26 of the substrate 22.

The side segments 96 include one or more optional alignment posts 124 that extend outwardly from the mounting surface 120. The alignment posts 124 are configured to be received within openings 126 (FIG. 2) of the substrate 22 for positioning the guide frame 32 relative to the substrate 22. The guide frame 32 may include any number of the openings 122 and any number of the alignment posts 126. In addition or alternative to the openings 122 and/or the alignment posts 124, the guide frame 32 may be mounted on the substrate 22 using any other structure, means, fasteners, and/or the like, such as, but not limited to, using a latch, a clip, an interference (or clearance) fit, a snap fit, and/or the like.

The guide frame 32 includes one or more cross members 128 that extend between, and interconnect, the side segments 96. Specifically, in the exemplary embodiment, the guide frame 32 includes a cross member 128a that extends from the mating end 102 of one of the side segments 96a to the mating end 102 of the other side segment 96b. A cross member 128b extends from the loading end 100 of the side segment 96a to the loading end 100 of the side segment 96b. The cross members 128a and 128b thereby interconnect the side segments 96a and 96b at different locations along the lengths of the side segments 96a and 96b. The cross member 128b includes a surface 130 that engages the side 82 (FIG. 3) of the pluggable module 16 when the pluggable module 16 is received within the receptacle 18.

The cross members 128 may facilitate increasing a strength and/or stiffness of the guide frame 32. The cross members 128 may facilitate providing a predetermined relative position and/or orientation between the side segments 96, and therefore between the guide rails 106 and 108 of the side segment 96a and the guide rails 106 and 108 of the side segment 96b. For example, lengths of the cross members 128a and/or 128b may be selected to provide a predetermined distance between the loading ends 100, the mating ends 102, and/or other portions of the side segments 96a and 96b. Although two are shown, the guide frame 32 may include any number of the cross members 128, each extending from any location along the length of the side segment 96a and from any location along the length of the side segment 96b. In some alternative embodiments, the cross members 128a and/or 128b may include one or more of the openings 122 and/or one or more of the alignment posts 124, in addition or alternative to the openings 122 and/or alignments posts 124 of the side segments 96a and/or 96b. Each of the cross members 128a and 128b is optionally integrally formed with the side segments 96a and/or 96b.

Figure 5:
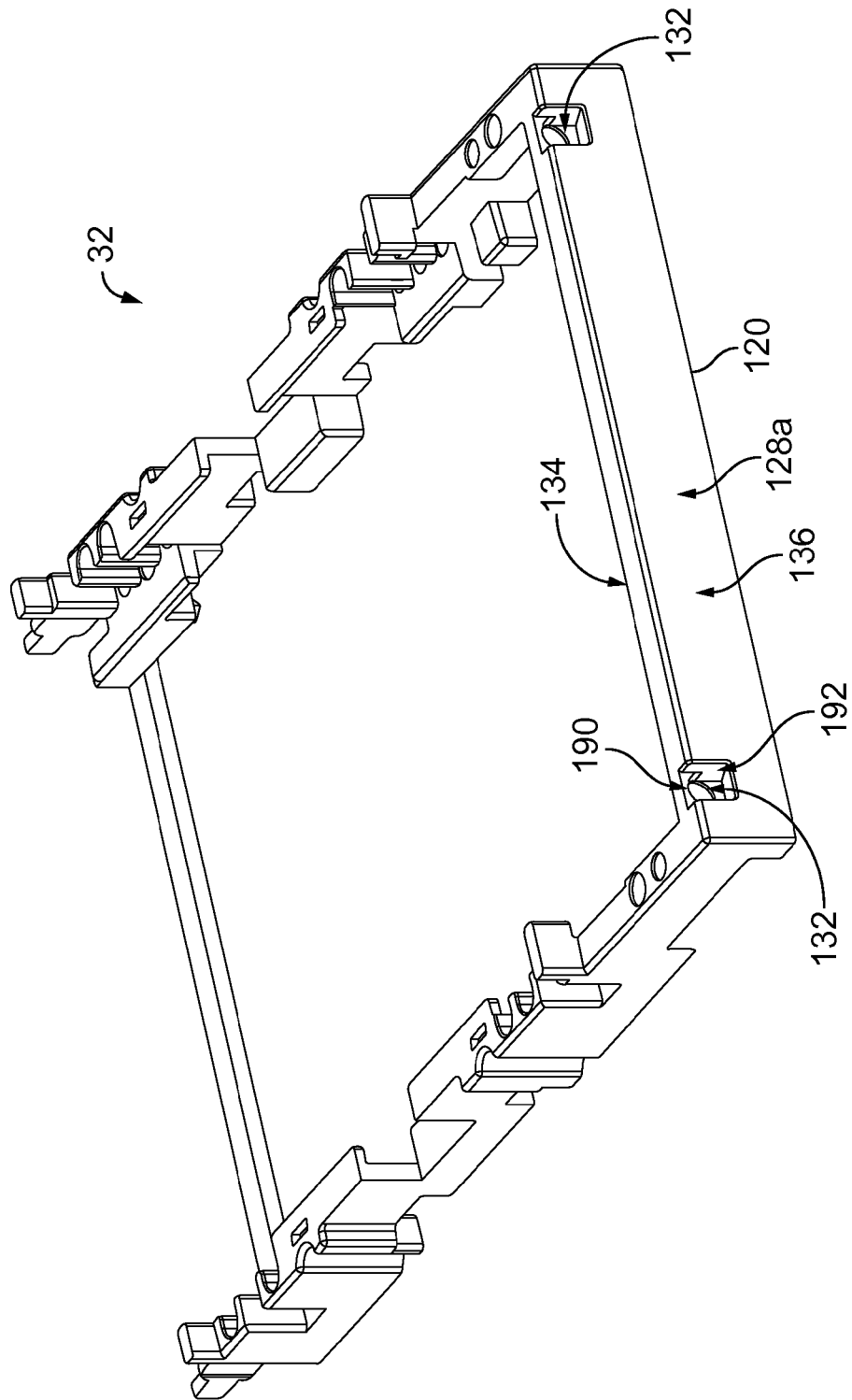
FIG. 5 is a perspective view of the guide frame shown in FIG. 4 taken from a different angle than FIG. 4.

FIG. 5 is a perspective view of the guide frame 32 taken from a different angle than FIG. 4. Referring now to FIGS. 4 and 5, the cross member 128a includes one or more openings 132 extending therethrough. As will be described below, the openings 132 are used to mechanically connect the cover 34 (FIGS. 2 and 6-9) to the guide frame 32. The cross member 128a includes a side 134 and a side 136 that is opposite the side 134. The cross member 128a also includes the mounting surface 120, which interconnects the sides 134 and 136. The openings 132 extend completely through the cross member 128a. Specifically, the openings 132 extend through the side 134, through the side 136, and completely through the cross member 128a therebetween. As can be seen in FIG. 4, each opening 132 optionally extends through a portion of the mounting surface 120. The openings 132 may be referred to herein as "frame openings".

Figure 8:
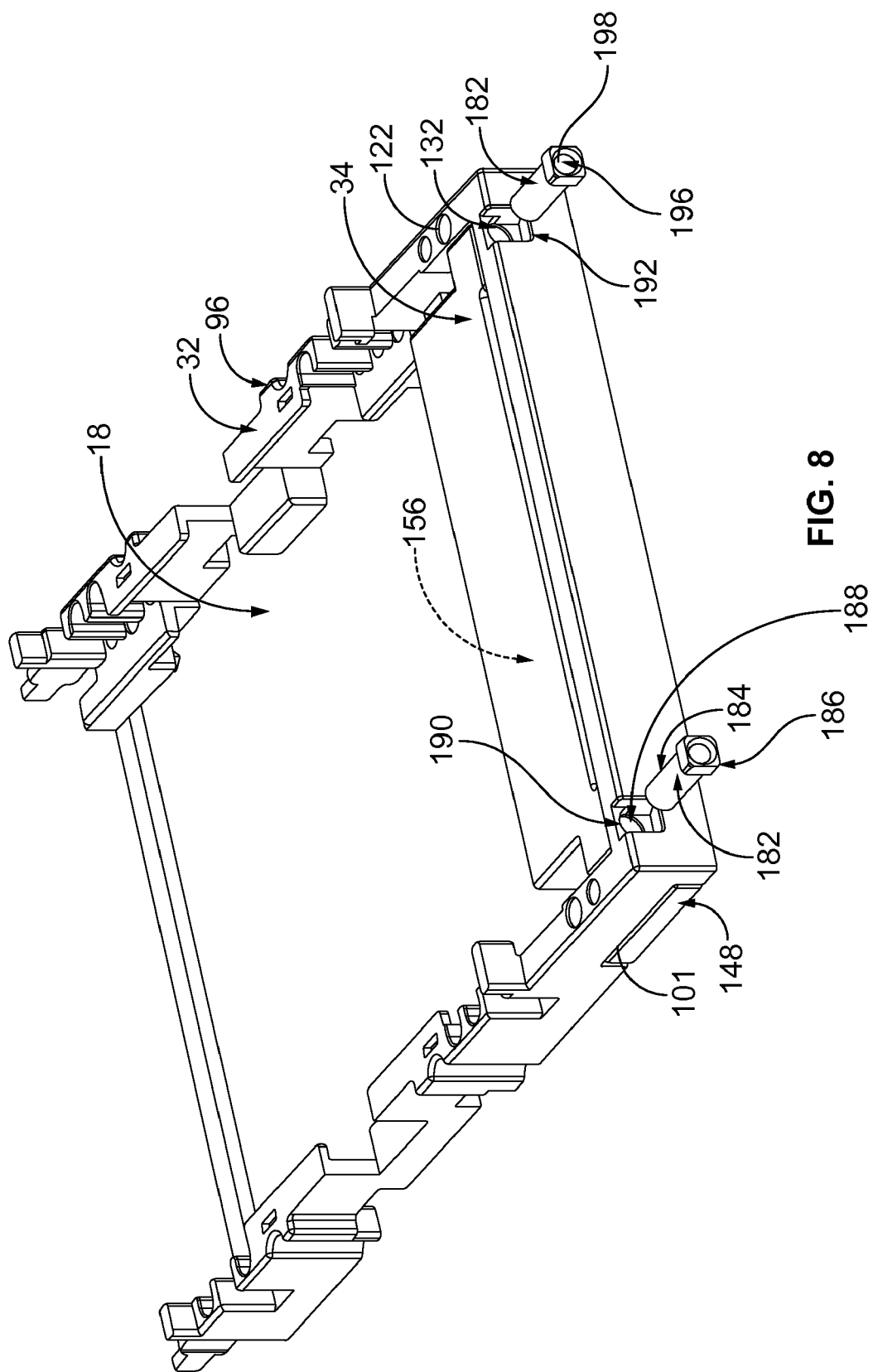
FIG. 8 is a partially exploded perspective view illustrating the cover shown in FIGS. 6 and 7 mechanically connected to the guide frame shown in FIGS. 4 and 5.

In the exemplary embodiment, the openings 132 are configured to receive an insert 182 (FIGS. 8 and 9) therein to mechanically connect the cover 34 to the guide frame 32. As can be seen in FIG. 8, the insert 182 includes a cylindrical barrel 184 and a rectangular base 186. Accordingly, in the exemplary embodiment, each of the openings 132 includes various shapes that enable the openings 132 to receive the insert 182. For example, the openings 132 include an arch shaped segment 188 that extends through the side 134 of the cross member 128a, which can be seen in FIG. 4, and a cylindrically shaped segment 190 that can be seen in FIG. 5. The arch and cylindrical shaped segments 188 and 190, respectively, of the openings 132 enable the openings 132 to receive the cylindrical barrel 184 of the insert 182. Moreover, and for example, the openings 132 include a rectangular shaped segment 192 that extends through the side 136 of the cross member 128a and can be seen in FIG. 5. The rectangular shaped segment 192 of the openings 132 enables the openings 132 to receive rectangular base 186 of the insert 182. However, in addition or alternative to the shapes shown and/or described herein, each opening 132 may include any other shape that enables the opening 132 to facilitate mechanically connecting the cover 34 to the guide frame 32. For example, each opening 132 may additionally or alternatively include any other shape that enables the opening 132 to receive an insert that includes any shape. Moreover, and for example, each opening 132 may additionally or alternatively include any other shape that enables the opening 132 to receive any other type of fastener having any shape. Although two openings 132 are shown, the guide frame 32 may include any number of the openings 132. In some alternative embodiments, one or more of the openings 132 is threaded for engaging a threaded fastener to mechanically connect the cover 34 to the guide frame 32.

Figure 6:
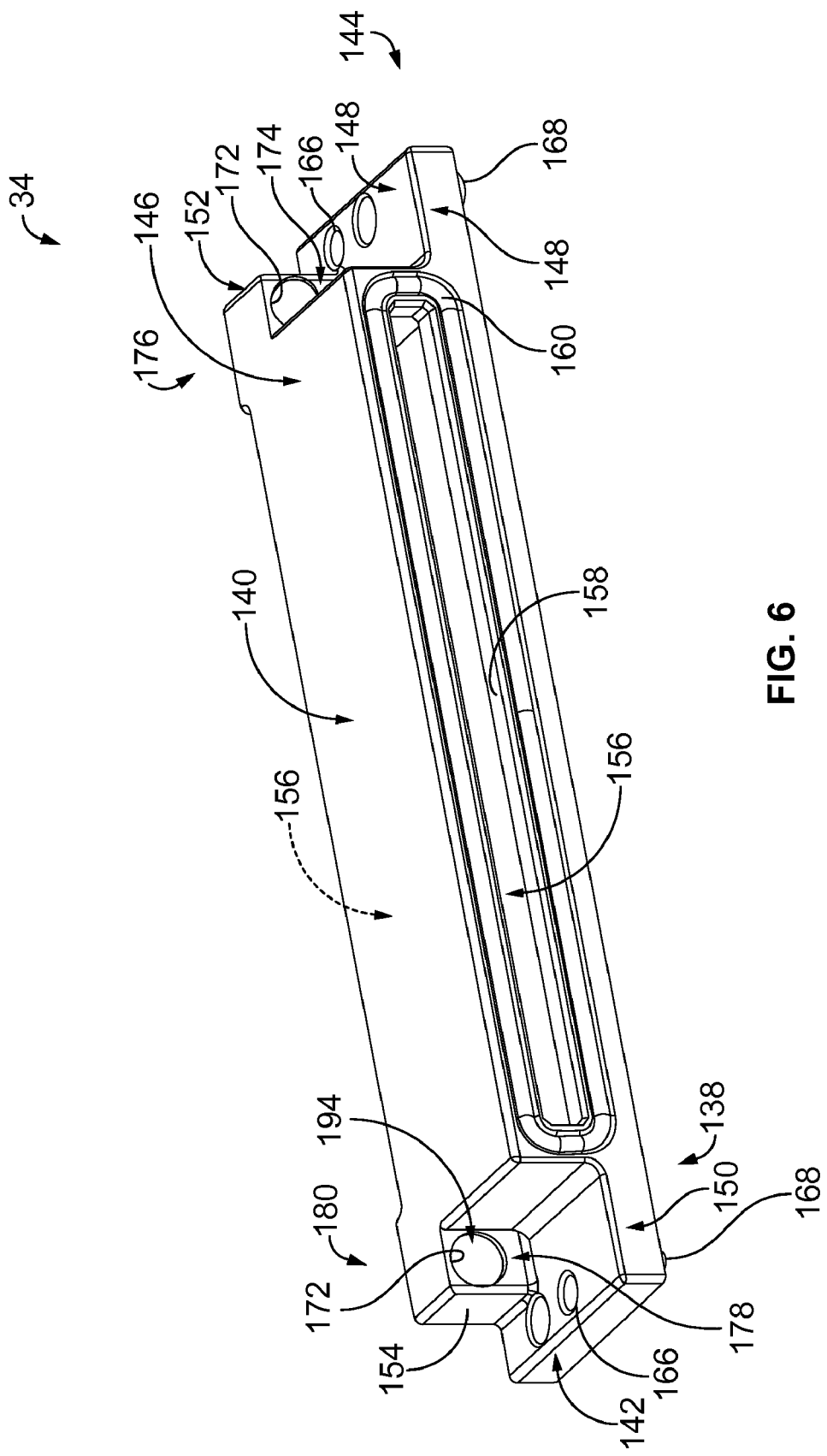
FIG. 6 is a perspective view of an exemplary embodiment of a cover of the connector assembly shown in FIGS. 1 and 2.
Figure 7:
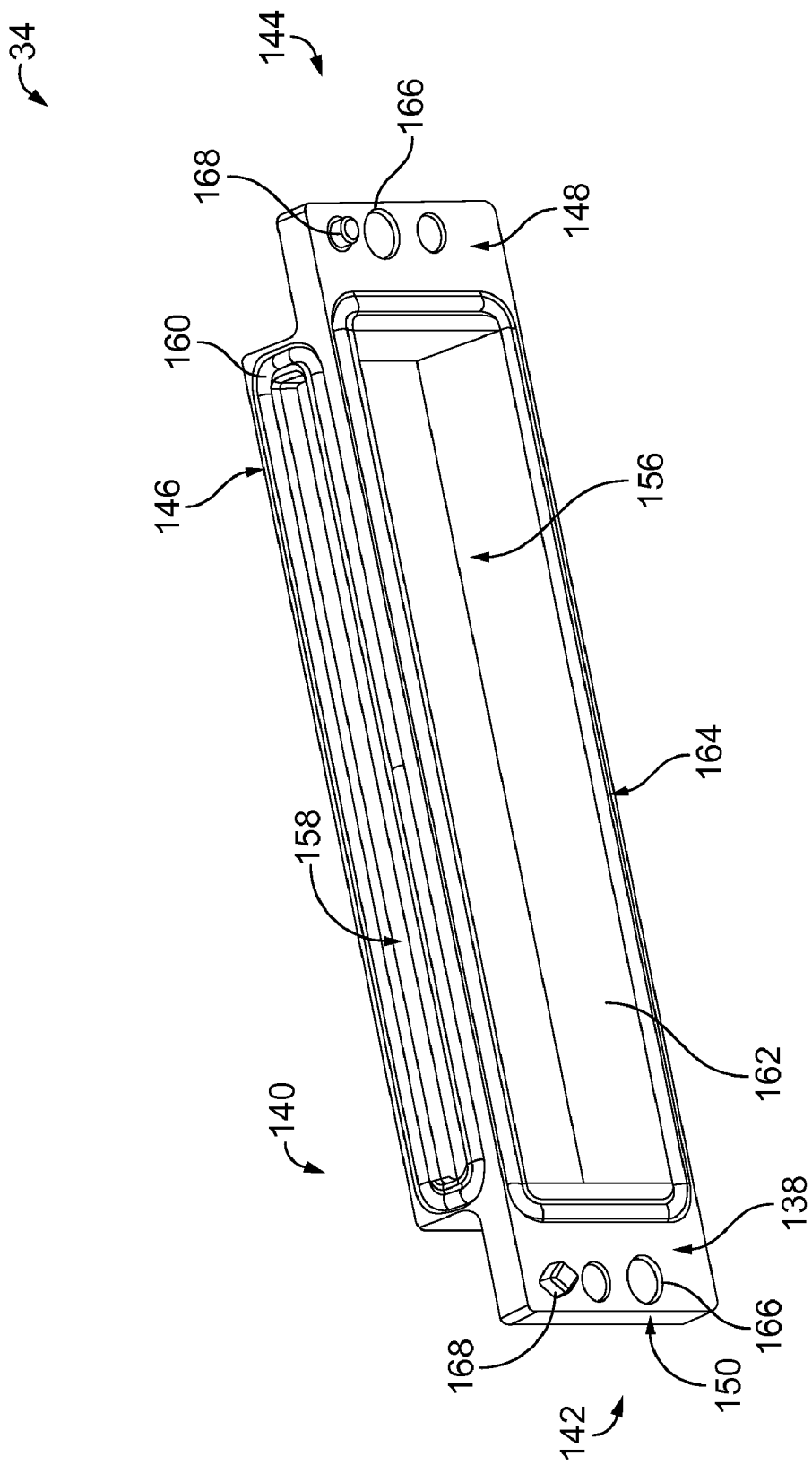
FIG. 7 is a perspective view of the cover shown in FIG. 6 taken from a different angle than FIG. 6.

FIG. 6 is a perspective view of an exemplary embodiment of the cover 34. FIG. 7 is a perspective view of the cover 34 taken from a different angle than FIG. 6. The cover 34 includes a side 138 and a side 140 that is opposite the side 138. The cover 34 extends a length from an end 142 to an opposite end 144. The cover 34 includes a hood 146 that extends between the ends 142 and 144. The ends 142 and 144 of the cover 34 include respective flanges 150 and 148 that extend outwardly from the hood 146. As will be described below, the flanges 148 and 150 are received within the recesses 101 (FIGS. 4, 8, and 9) of the guide frame 32 (FIGS. 2, 4, 5, 8, and 9) when the cover 34 is mechanically connected to the guide frame 32. Mounting ears 152 and 154 (not visible in FIG. 7) extend from the flanges 148 and 150, respectively, and from the hood 146. The hood 146 defines a cavity 156 that is configured to receive at least a portion of the interface connector 30 (FIG. 2) therein, such that the hood 146 covers at least a portion of the interface connector 30. A port 158 extends through the hood 146 into communication with the cavity 156. The port 158 enables the pluggable module 16 (FIGS. 1 and 3) to mate with the interface connector 30 through the cover 34. An optional electromagnetic interference (EMI) gasket 160 extends around the port 158.

The side 138 of the cover 34 is configured to be mounted on the substrate 22 (FIG. 2). An opening 162 (not visible in FIG. 6) extends through the side 138 into communication with the cavity 156. The opening 162 enables the interface connector 30 to mechanically and/or electrically connect to the substrate 22 through the cover 34. An optional EMI gasket 164 (not visible in FIG. 6) extends around the opening 162. The cover 34 includes a plurality of openings 166 for mounting the cover 34 on the substrate 22. In the exemplary embodiment, the openings 166 extend through the flanges 148 and 150. Optionally, when the cover 34 is mechanically connected to the guide frame 32, at least one of the openings 166 of the cover 34 aligns with a corresponding one of the openings 122 (FIGS. 4, 8, and 9) of the guide frame 32. Accordingly, the same fastener (not shown) can optionally be used with openings 122 and 166 that are aligned to mount the guide frame 32 and cover 34 on the substrate 22. Each of the openings 166 is optionally threaded for engaging a threaded fastener.

The cover 34 includes one or more optional alignment posts 168 that extend outwardly from the side 138. In the exemplary embodiment, the each of the flanges 148 and 150 includes an alignment post 168. In addition or alternative, one or more optional alignment posts 168 may be located at any other location of the cover 34 than the flanges 148 and/or 150. The alignment posts 168 are configured to be received within openings 170 (FIG. 2) of the substrate 22 for positioning the cover 34 relative to the substrate 22. The cover 34 may include any number of the openings 166 and any number of the alignment posts 168. In addition or alternative to the openings 166 and/or the alignment posts 168, the cover 34 may be mounted on the substrate 22 using any other structure, means, fasteners, and/or the like, such as, but not limited to, using a latch, a clip, an interference (or clearance) fit, a snap fit, and/or the like.

Referring now to FIG. 6, the cover 34 includes one or more openings 172. The openings 172 are used to mechanically connect the cover 34 to the guide frame 32. In the exemplary embodiment, the cover 34 includes two openings 172 that are each located on a corresponding one of the mounting ears 152 and 154. The mounting ear 152 includes opposite sides 174 and 176, and the mounting ear 154 includes opposite sides 178 and 180. The openings 172 extend completely through the corresponding mounting ears 152 and 154. Specifically, the opening 172 of the mounting ear 152 extends through the side 174, through the side 176, and completely through the mounting ear 152 therebetween. Similarly, the opening 172 of the mounting ear 154 extends through the side 178, through the side 180, and completely through the mounting ear 154 therebetween. The openings 172 may be referred to herein as "cover openings".

Each opening 172 of the cover 34 aligns with a corresponding one of the openings 132 (FIGS. 4, 5, 8, and 9) of the guide frame 32. In the exemplary embodiment, the openings 172 are configured to receive the insert 182 (FIGS. 8 and 9) therein to mechanically connect the cover 34 to the guide frame 32. Accordingly, in the exemplary embodiment, each of the openings 172 includes various shapes that enable the openings 172 to receive the insert 182. For example, the openings 172 include a cylindrically shaped segment 194 that can be seen in FIG. 6. The cylindrically shaped segment 194 of the openings 172 enables the openings 172 to receive the cylindrical barrel 184 (FIGS. 8 and 9) of the insert 182. However, in addition or alternative to the shapes shown and/or described herein, each opening 172 may include any other shape that enables the opening 172 to facilitate mechanically connecting the cover 34 to the guide frame 32. For example, each opening 172 may additionally or alternatively include any other shape that enables the opening 172 to receive an insert that includes any shape. Moreover, and for example, each opening 172 may additionally or alternatively include any other shape that enables the opening 172 to receive any other type of fastener having any shape. Although two openings 172 are shown, the cover 34 may include any number of the openings 172. Moreover, each mounting ear 152 and 154 may include any number of the openings 172. In addition or alternative to the mounting ears 152 and/or 154, one or more openings 172 may be located at any other location on the cover 34 that enables the cover 34 to be mechanically connected to the guide frame 32. In some alternative embodiments, one or more of the openings 172 is threaded for engaging a threaded fastener to mechanically connect the cover 34 to the guide frame 32.

Figure 9:
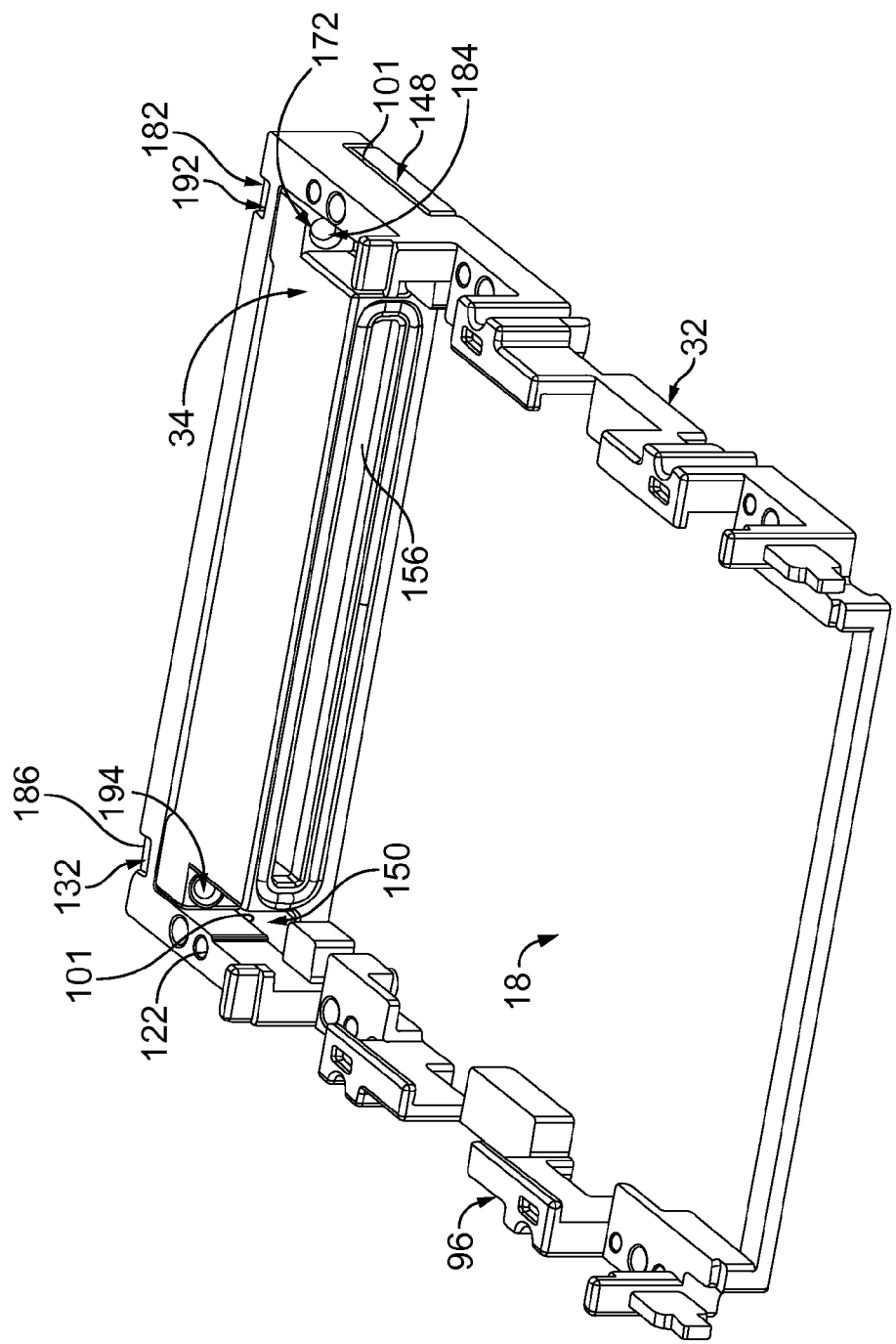
FIG. 9 is a perspective view of the cover and guide frame shown in FIG. 8 taken from a different angle than FIG. 8.

FIG. 8 is a partially exploded perspective view illustrating the cover 34 mechanically connected to the guide frame 32. FIG. 9 is a perspective view of the cover 34 and guide frame 32 taken from a different angle than FIG. 8. As can be seen in FIGS. 8 and 9, the cover 34 can be mechanically connected to the guide frame 32 before the guide frame 32 and cover 34 are mounted on the substrate 22 (FIG. 2), before the interface connector 30 (FIG. 2) is received within the cavity 156 of the cover 34, and/or before the pluggable module 16 (FIGS. 1 and 3) is received within the receptacle 18 of the guide frame 32.

To mechanically connect the cover 34 to the guide frame 32 as shown in FIGS. 8 and 9, the cover 34 is received within the receptacle 18 of the guide frame 32 such that the openings 172 (not visible in FIG. 8) of the cover 34 align with the openings 132 of the guide frame 32. The inserts 182 are received within the openings 132 and 172. Specifically, the cylindrical barrel 184 of each insert 182 is received within the cylindrical shaped segments 190 (not visible in FIG. 9) and 194 of the corresponding openings 132 and 172, respectively, and within the arch shaped segment 188 (not visible in FIG. 9) of the corresponding opening 132. The rectangular base 186 of each insert 182 is received within the rectangular shaped segment 192 of the corresponding opening 132 of the guide frame 32. In the exemplary embodiment, the cylindrical barrel 184 of each insert 182 engages surfaces defining the openings 172 and 132 of the cover 34 and the guide frame 32, respectively, in an interference (or clearance) fit. But, the inserts 182 may be received within the openings 132 and 172 in any other manner and/or the like that enables the inserts 182 to mechanically connect the cover 34 to the guide frame 32, such as, but not limited to, a snap fit, a "loose" engagement wherein there is a clearance between the barrel 184 and the surfaces that define the openings 132 and/or 172, and/or the like. Optionally, one or more of the inserts 182 includes an internal passageway 196 (not visible in FIG. 9) having an internal thread 198 (not visible in FIG. 9) for receiving a threaded fastener (not shown). The threaded fastener optionally expands the cylindrical barrel 184 of the insert 182 such that the barrel 184 engages the cover 34 and the guide frame 32 in the interference fit. In alternative to the expansion, the cylindrical barrel 184 may have an unexpanded size that provides the interference fit, whether or not the insert 182 receives a threaded fastener.

As can be seen in FIGS. 8 and 9, the flanges 148 and 150 are received within the recesses 101 of the guide frame 32. Only the flange 148 is visible in FIG. 8). The openings 122 within the side segments 96 of the guide frame 32 align with the openings 166 (FIGS. 6 and 7) within the flanges 148 and 150. The fasteners that, in some embodiments, are received through the openings 122 and 166 to mount the guide frame 32 and cover 34 on the substrate 22 (FIG. 2) also facilitate mechanically connecting the cover 34 to the guide frame 32. In some alternative embodiments, the cover 34 is mechanically connected to guide frame 32 using the openings 122 and 166 and the fasteners received therethrough instead of using the openings 132, the openings 172, and/or the inserts 182.

In addition or alternative to the openings 132, the openings 172, the inserts 182, and/or the openings 122 and 166 and the fasteners received therein, the cover 34 may be mechanically connected to the guide frame 32 using any other structure, means, fasteners, and/or the like. Examples of other structures, means, fasteners, and/or the like for mechanically connecting the guide frame 32 and the cover 34 include, but are not limited to, a latch, a clip, a snap fit between the cover 34 and guide frame 32, an interference (or clearance) fit between the cover 34 and the guide frame 32, a threaded fastener, a differently sized and/or shaped insert, and/or the like.

The embodiments described and/or illustrated herein may provide a guide rails that more accurately align a pluggable module with an interface connector than at least some known guide rails. For example, the embodiments described and/or illustrated herein may provide guide rails that are more accurately positioned relative to each other than at least some known guide rails. The embodiments described and/or illustrated herein may provide a receptacle assembly having fewer separate components than at least some known receptacle assemblies. The embodiments described and/or illustrated herein may provide a receptacle assembly that is less difficult, time consuming, and/or costly to assemble than at least some known receptacle assemblies.

It is to be understood that the above description and the figures are intended to be illustrative, and not restrictive. For example, the above-described and/or illustrated embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components (including the terms "upper", "lower", "vertical", and "lateral"), and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description and the figures. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A guide frame for a pluggable module having guide members that include upper and lower surfaces, said guide frame comprising:
   side segments extending lengths from loading ends to mating ends, the side segments being spaced apart from each other to define a receptacle extending therebetween, the receptacle being configured to receive the pluggable module therein, the side segments comprising upper and lower guide rails for guiding the pluggable module within the receptacle, the upper and lower guide rails being configured to engage the upper and lower surfaces, respectively, of the guide members of the pluggable module when the pluggable module is received within the receptacle; and
   a cross member extending from, and interconnecting, the loading ends of the side segments.

2. The guide frame according to claim 1, wherein the side segments comprise inner surfaces that define boundaries of the receptacle, the upper and lower guide rails comprising extensions that extend outwardly from the inner surfaces of the side segments into the receptacle.

3. The guide frame according to claim 1, wherein at least one of the side segments comprises at least one upper guide rail and at least one lower guide rail, a slot being defined by the upper and lower guide rails of the at least one side segment, the slot being configured such that the guide member of the pluggable module is configured to be received therein.

4. The guide frame according to claim 1, wherein the cross member is a first cross member, the guide frame further comprising a second cross member that extends from, and interconnects, the mating ends of the side segments.

5. The guide frame according to claim 1, wherein the cross member comprises cross members that each extend from, and interconnect, the side segments at different locations along the lengths of the side segments.

6. The guide frame according to claim 1, wherein each of the side segments comprises at least one upper guide rail and at least one lower guide rail.

7. The guide frame according to claim 1, wherein at least one of the side segments comprises at least one upper guide rail and at least one lower guide rail, the upper guide rail of the at least one side segment comprising an upper guide element, the lower guide rail of the at least one side segment comprising a lower guide element that is positioned at a different location along the length of the at least one side segment than the upper guide element of the at least one side segment.

8. The guide frame according to claim 1, wherein at least one of the side segments comprises at least one upper guide rail that is segmented along the length of the at least one side segment into at least two upper guide elements that are spaced apart from each other along the length of the at least one side segment.

9. The guide frame according to claim 1, wherein at least one of the side segments comprises at least one upper guide rail having at least two upper guide elements and at least one lower guide rail having a lower guide element, the at least two upper guide elements being spaced apart from each other along the length of the at least one side segment by the lower guide element of the lower guide rail of the at least one side segment.

10. The guide frame according to claim 1, wherein the cross member is integrally formed with the side segments.

11. A guide frame for a pluggable module having guide members that include upper and lower surfaces, said guide frame comprising:
    side segments extending lengths from loading ends to mating ends, the side segments being spaced apart from each other to define a receptacle extending therebetween, the receptacle being configured to receive the pluggable module therein, the side segments comprising upper and lower guide rails for guiding the pluggable module within the receptacle, the upper and lower guide rails being configured to engage the upper and lower surfaces, respectively, of the guide members of the pluggable module when the pluggable module is received within the receptacle, wherein at least one of the side segments comprises at least one upper guide rail and at least one lower guide rail, the upper guide rail of the at least one side segment comprising an upper guide element, the lower guide rail of the at least one side segment comprising a lower guide element, the upper and lower guide elements comprising upper and lower guide surfaces, respectively, that extend approximately parallel to each other; and a cross member extending from, and interconnecting, the side segments.

12. A receptacle assembly for a pluggable module that mates with an interface connector, said receptacle assembly comprising:

a guide frame comprising side segments extending lengths from loading ends to mating ends, the side segments being spaced apart from each other to define a receptacle extending therebetween, the receptacle being configured to receive the pluggable module therein;

a cover configured to cover at least a portion of the interface connector, wherein the cover is mechanically connected to the guide frame; and wherein the guide frame comprises a frame opening and the cover comprises a cover opening aligned with the frame opening, an insert being received within cover and frame openings to mechanically connect the cover to the guide frame, the insert comprising an internal thread.

13. The assembly according to claim 12, wherein the guide frame comprises a cross member that extends from, and interconnects the side segments of the guide frame, the cover being mechanically connected to the cross member.

14. The assembly according to claim 12, wherein the guide frame comprises a frame opening and the cover comprises a cover opening aligned with the frame opening, an insert being received within cover and frame openings to mechanically connect the cover to the guide frame.

15. The assembly according to claim 12, wherein the cover comprises a mounting ear that includes an opening configured to receive an insert for mechanically connecting the cover to the guide frame.

16. The assembly according to claim 12 wherein the guide frame comprises a cross member that extends from, and interconnects the mating ends of the side segments of the guide frame, the cover being mechanically connected to the cross member.

17. The assembly according to claim 12, wherein the cover comprises a port positioned to enable the pluggable module to mate with the interface connector through the cover.

18. The assembly according to claim 12, wherein the cover comprises an opening configured to receive a fastener for mounting the cover on a printed circuit.

19. The assembly according to claim 12, wherein the interface connector includes a housing, the cover being configured to cover at least a portion of the housing of the interface connector.

20. The assembly according to claim 12, wherein the interface connector includes a housing, the cover comprising a cavity that is configured to receive at least a portion of the housing of the interface connector therein.

* * * * *